(12) United States Patent
Perry

(10) Patent No.: US 9,548,632 B2
(45) Date of Patent: Jan. 17, 2017

(54) OSCILLATORS FOR WIRELESS POWER TRANSFER

(71) Applicant: uBeam, Inc., Santa Monica, CA (US)

(72) Inventor: Meredith Perry, Marina del Rey, CA (US)

(73) Assignee: UBEAM INC., Santa Monica, CA (US)

( * ) Notice: Subject to any disclaimer, the term of this patent is extended or adjusted under 35 U.S.C. 154(b) by 95 days.

(21) Appl. No.: 14/680,388

(22) Filed: Apr. 7, 2015

(65) Prior Publication Data

US 2015/0213791 A1 Jul. 30, 2015

Related U.S. Application Data

(63) Continuation of application No. 14/635,861, filed on Mar. 2, 2015, which is a continuation of application
(Continued)

(51) Int. Cl.
*G10K 11/18* (2006.01)
*G10K 11/34* (2006.01)
(Continued)

(52) U.S. Cl.
CPC .............. *H02J 50/15* (2016.02); *G10K 11/18* (2013.01); *G10K 11/26* (2013.01); *G10K 11/341* (2013.01);
(Continued)

(58) Field of Classification Search
CPC ............ H02J 5/005; H02J 50/80; H02J 50/15; H02J 7/025; H02J 7/0052; H02J 17/00; H04B 11/00; G10K 11/18; G10K 11/341; G10K 11/26; G10K 11/346; H04R 19/00; H04R 23/00; H04R 17/00; B60L 11/182; Y02T 90/122; H03C 3/02; H03C 5/00; Y02E 60/12
See application file for complete search history.

(56) References Cited

U.S. PATENT DOCUMENTS 3,722,447 A 3/1973 Altar et al.
3,946,831 A 3/1976 Bouyoucos
(Continued)

FOREIGN PATENT DOCUMENTS

CN 102184729 A 9/2011
EP 1423685 B1 8/2011
(Continued)

OTHER PUBLICATIONS

International Preliminary Report on Patentability for International Application No. PCT/US2014/028133, mailed Sep. 24, 2015.
(Continued)

*Primary Examiner* — Daniel Pihulic
(74) *Attorney, Agent, or Firm* — Morris & Kamlay LLP

(57) ABSTRACT

A signal generator generates an electrical signal that is sent to an amplifier, which increases the power of the signal using power from a power source. The amplified signal is fed to a sender transducer to generate ultrasonic waves that can be focused and sent to a receiver. The receiver transducer converts the ultrasonic waves back into electrical energy and stores it in an energy storage device, such as a battery, or uses the electrical energy to power a device. In this way, a device can be remotely charged or powered without having to be tethered to an electrical outlet.

22 Claims, 3 Drawing Sheets

Related U.S. Application Data

No. 13/477,551, filed on May 22, 2012, now Pat. No. 9,001,622.

(60) Provisional application No. 61/490,988, filed on May 27, 2011.

(51) Int. Cl.

| | | |
|---|---|---|
| H02J 7/00 | (2006.01) | |
| H03C 3/02 | (2006.01) | |
| H02J 7/02 | (2016.01) | |
| H04R 19/00 | (2006.01) | |
| H04B 11/00 | (2006.01) | |
| H02J 5/00 | (2016.01) | |
| H02J 17/00 | (2006.01) | |
| G10K 11/26 | (2006.01) | |
| H03C 5/00 | (2006.01) | |
| H04R 17/00 | (2006.01) | |
| H04R 23/00 | (2006.01) | |
| H01F 38/14 | (2006.01) | |
| B60L 11/18 | (2006.01) | |

(52) U.S. Cl.
CPC ............. *G10K 11/346* (2013.01); *H02J 5/005* (2013.01); *H02J 7/0052* (2013.01); *H02J 7/025* (2013.01); *H02J 17/00* (2013.01); *H02J 50/80* (2016.02); *H03C 3/02* (2013.01); *H03C 5/00* (2013.01); *H04B 11/00* (2013.01); *H04R 17/00* (2013.01); *H04R 19/00* (2013.01); *H04R 23/00* (2013.01); *B60L 11/182* (2013.01); *H01F 38/14* (2013.01); *Y02E 60/12* (2013.01); *Y02T 90/122* (2013.01)

(56) References Cited

U.S. PATENT DOCUMENTS

| | | | |
|---|---|---|---|
| 3,976,968 A | | 8/1976 | Slaton et al. |
| 4,003,256 A | | 1/1977 | Donelan et al. |
| 4,849,872 A | | 7/1989 | Gassler |
| 4,864,547 A | | 9/1989 | Krsna et al. |
| 4,882,714 A | * | 11/1989 | Tanigawa ............... G01S 15/02 367/103 |
| 4,896,304 A | * | 1/1990 | Tanigawa ............... G01S 15/02 367/103 |
| 5,198,716 A | | 3/1993 | Godshall et al. |
| 5,376,221 A | | 12/1994 | Staudte |
| 5,436,523 A | | 7/1995 | Staudte |
| 5,605,154 A | * | 2/1997 | Ries ................... G01S 7/52046 600/444 |
| 5,892,315 A | | 4/1999 | Gipson et al. |
| 5,900,690 A | | 5/1999 | Gipson et al. |
| 6,003,390 A | | 12/1999 | Cousy et al. |
| 6,037,704 A | | 3/2000 | Welle |
| 6,118,205 A | | 9/2000 | Wood et al. |
| 6,127,942 A | | 10/2000 | Welle |
| 6,479,890 B1 | | 11/2002 | Trieu et al. |
| 6,503,204 B1 | | 1/2003 | Sumanaweera et al. |
| 6,792,808 B1 | | 9/2004 | Batzinger et al. |
| 6,798,716 B1 | * | 9/2004 | Charych ................. H02J 17/00 367/119 |
| 7,443,057 B2 | | 10/2008 | Nunally et al. |
| 7,446,456 B2 | | 11/2008 | Maruyama et al. |
| 7,460,439 B2 | | 12/2008 | Moon et al. |
| 7,489,967 B2 | | 2/2009 | Von Arx et al. |
| 7,490,519 B2 | | 2/2009 | Subramanian et al. |
| 7,606,621 B2 | | 10/2009 | Brisken et al. |
| 7,610,092 B2 | | 10/2009 | Cowan et al. |
| 7,687,976 B2 | | 3/2010 | Haider et al. |
| 7,710,002 B2 | | 5/2010 | Horie et al. |
| 7,902,943 B2 | | 3/2011 | Sherrit et al. |
| 8,013,640 B1 | | 9/2011 | Chu et al. |
| 8,053,949 B2 | | 11/2011 | Wirtl et al. |
| 8,082,041 B1 | | 12/2011 | Radziemski |
| 8,159,364 B2 | | 4/2012 | Zeine |
| 8,369,960 B2 | | 2/2013 | Tran et al. |
| 8,593,107 B2 | | 11/2013 | Penner et al. |
| 8,649,875 B2 | | 2/2014 | Sarvazyan |
| 8,692,505 B2 | | 4/2014 | Chu et al. |
| 8,718,773 B2 | | 5/2014 | Willis et al. |
| 8,816,567 B2 | | 8/2014 | Zuo et al. |
| 8,961,421 B2 | | 2/2015 | Wodnicki |
| 9,001,622 B2 | * | 4/2015 | Perry .................... H04B 11/00 367/138 |
| 9,024,582 B2 | | 5/2015 | Penner et al. |
| 9,030,161 B2 | | 5/2015 | Lu et al. |
| 9,094,110 B2 | * | 7/2015 | Perry .................... H04B 11/00 |
| 9,094,111 B2 | | 7/2015 | Perry |
| 9,094,112 B2 | * | 7/2015 | Perry .................... H04B 11/00 |
| 9,214,151 B2 | | 12/2015 | Perry |
| 2001/0035700 A1 | | 11/2001 | Percin et al. |
| 2003/0011285 A1 | | 1/2003 | Ossmann et al. |
| 2003/0020376 A1 | | 1/2003 | Sakaguchi et al. |
| 2003/0048698 A1 | | 3/2003 | Barnes et al. |
| 2004/0066708 A1 | | 4/2004 | Ogawa |
| 2004/0172083 A1 | | 9/2004 | Penner |
| 2004/0204744 A1 | | 10/2004 | Penner et al. |
| 2005/0070962 A1 | | 3/2005 | Echt et al. |
| 2005/0207589 A1 | | 9/2005 | Biegelsen et al. |
| 2007/0109121 A1 | | 5/2007 | Cohen |
| 2007/0150019 A1 | | 6/2007 | Youker et al. |
| 2008/0071171 A1 | | 3/2008 | Amemiya et al. |
| 2008/0184549 A1 | | 8/2008 | Nguyen-Dinh et al. |
| 2008/0287791 A1 | | 11/2008 | Orszulak et al. |
| 2008/0287838 A1 | | 11/2008 | Orszulak et al. |
| 2008/0309452 A1 | | 12/2008 | Zeine |
| 2009/0016163 A1 | | 1/2009 | Freeman et al. |
| 2009/0201148 A1 | * | 8/2009 | Tran .................. A61N 1/37217 340/539.12 |
| 2009/0241675 A1 | | 10/2009 | Takada et al. |
| 2010/0027379 A1 | | 2/2010 | Saulnier et al. |
| 2010/0125292 A1 | | 5/2010 | Wiener et al. |
| 2010/0127787 A1 | | 5/2010 | Kurogo et al. |
| 2010/0157019 A1 | | 6/2010 | Schwotzer et al. |
| 2010/0164433 A1 | | 7/2010 | Janefalkar et al. |
| 2010/0222848 A1 | | 9/2010 | Forsell et al. |
| 2010/0286744 A1 | | 11/2010 | Echt et al. |
| 2010/0315045 A1 | | 12/2010 | Zeine |
| 2011/0060225 A1 | | 3/2011 | Cogan et al. |
| 2011/0060226 A1 | | 3/2011 | Yen et al. |
| 2011/0077583 A1 | | 3/2011 | Kadziauskas et al. |
| 2011/0144494 A1 | | 6/2011 | Mehi et al. |
| 2011/0301464 A1 | | 12/2011 | Yoo et al. |
| 2012/0010560 A1 | | 1/2012 | Kadzlauskas et al. |
| 2012/0071762 A1 | | 3/2012 | Sato et al. |
| 2012/0116268 A1 | | 5/2012 | Orszulak et al. |
| 2012/0155220 A1 | * | 6/2012 | Lee .......................... G01S 11/14 367/129 |
| 2012/0171963 A1 | | 7/2012 | Tsfaty et al. |
| 2012/0193999 A1 | | 8/2012 | Zeine |
| 2012/0299540 A1 | | 11/2012 | Perry |
| 2012/0299541 A1 | | 11/2012 | Perry |
| 2012/0299542 A1 | | 11/2012 | Perry |
| 2012/0300588 A1 | | 11/2012 | Perry |
| 2012/0300592 A1 | | 11/2012 | Perry |
| 2012/0300593 A1 | | 11/2012 | Perry |
| 2012/0326660 A1 | | 12/2012 | Lu et al. |
| 2013/0069587 A1 | | 3/2013 | Kuk et al. |
| 2013/0069865 A1 | | 3/2013 | Hart et al. |
| 2013/0182666 A1 | | 7/2013 | Sutskover et al. |
| 2013/0207604 A1 | | 8/2013 | Zeine |
| 2013/0239700 A1 | | 9/2013 | Benfield et al. |
| 2013/0241468 A1 | | 9/2013 | Moshfeghi |
| 2013/0264663 A1 | | 10/2013 | Dehe et al. |
| 2013/0271088 A1 | | 10/2013 | Hwang et al. |
| 2014/0163431 A1 | | 6/2014 | Orszulak et al. |
| 2014/0187960 A1 | | 7/2014 | Corl et al. |
| 2014/0225715 A1 | | 8/2014 | Moran |
| 2014/0243676 A1 | | 8/2014 | Cogan et al. |
| 2014/0334266 A1 | | 11/2014 | Cogan et al. |
| 2014/0340032 A1 | | 11/2014 | Curtis |

(56) References Cited

U.S. PATENT DOCUMENTS

| | | | |
|---|---|---|---|
| 2015/0171974 A1* | 6/2015 | Perry | H04B 11/00 307/104 |
| 2015/0213791 A1* | 7/2015 | Perry | H04B 11/00 367/138 |
| 2015/0213792 A1 | 7/2015 | Perry | |
| 2015/0214764 A1* | 7/2015 | Perry | H04B 11/00 320/107 |
| 2015/0214765 A1 | 7/2015 | Perry | |
| 2015/0280837 A1 | 10/2015 | Perry | |
| 2015/0312683 A1 | 10/2015 | Perry | |
| 2015/0326034 A1 | 11/2015 | Perry et al. | |
| 2015/0326323 A1 | 11/2015 | Perry | |
| 2015/0333798 A1* | 11/2015 | Perry | G10K 11/346 320/108 |
| 2015/0333799 A1 | 11/2015 | Perry et al. | |
| 2015/0333800 A1 | 11/2015 | Perry et al. | |
| 2016/0218564 A1 | 7/2016 | Perry | |

FOREIGN PATENT DOCUMENTS

| | | |
|---|---|---|
| GB | 2386028 A | 9/2003 |
| JP | 07327299 A | 12/1995 |
| JP | 2002118440 A | 4/2002 |
| JP | 2007-306389 | 11/2007 |
| JP | 2008244964 A | 10/2008 |
| JP | 5435243 | 12/2013 |
| KR | 10-2009-0118873 | 12/2009 |
| WO | 00/21020 | 4/2000 |
| WO | 2006/069215 | 6/2006 |
| WO | 2012166583 A1 | 12/2012 |
| WO | 2013143630 A1 | 10/2013 |

OTHER PUBLICATIONS

Thesaurus.com, "Dictionary definition of Coherent", obtained from Thesaurus.com on Nov. 12, 2015, Thesaurus.com, 2015. p. 1.

Invitation to Pay Additional Fees and Partial International Search Report for PCT/US2014/028133 mailed Jul. 18, 2014.

Bao, et al., "High-power piezoelectric acoustic-electric power feedthru for metal walls", Proceedings of SPIE, vol. 6930, pp. 1-8, 2008.

Bao, et al., "Wireless piezoelectric acoustic-electric power feedthru", Proceedings of SPIE, vol. 6529, pp. 1-7, 2007.

Etherington, "Cota by Ossia Aims to Drive a Wireless Power Revolution and Change How We Think About Charging", Available at: http://techcrunch.com/2013/09/09/cota-by-ossia-wireless-power/. Date visited: Sep. 12, 2013, pp. 1-4, Sep. 9, 2013.

Germano, "Flexure Mode Piezoelectric Transducers", Morgan Electro Ceramics, Technical Publication TP-218. J. Acoust. Soc. Am. vol. 50, Issue 1A, pp. 1-6, 1971.

Intellectual Ventures, "MSA-T", Available at: http://www.intellectualventures.com/index.php/inventions-patents/our-inventions/msa-t. Date visited: Mar. 21, 2013., 2013.

Intellectual Ventures, "MSA-T: Enabling affordable, all-electronic beam steering satcom user terminals", Available at: http://www.intellectualventures.com/assets_docs/IV_metamaterials_technical_overview.pdf. Visited on: Mar. 21, 2013, 2011.

International Search Report, "in International Application No. PCT/US2012/039536", mailed Aug. 14, 2012.

Jiang, et al., "Multi-Channel Indoor Wireless Data Communication Using High-k Capacitive Ultrasonic Transducers in Air", Ultrasonics Symposium (IUS), 2013 IEEE International, Jul. 2013, Prague pp. 1606-1609, ISSN: 1948-5719.

Mobilitywire, "Ossia Unveils World's First Commercially Viable Remote Wireless Power System", Available at: http://www.mobilitywire.com/ossia/2013/09/10/7888. Date visited: Sep. 12, 2013, pp. 1-4, Sep. 10, 2013.

Morgan Electro Ceramics, "Cantilever Mounted PZT 5A Bimorphs", Technical Publication TP-245, pp. 1-8, 1999.

Murray, Susan L., et al., "Effect of mesa-shaping on spurious modes in ZnO/Si bulk-wave composite resonators", Institute of Electrical and Electronics Engineers, 1983, 498-503.

Nam-Trung Nguyen, et al., "Acoustic streaming in micromachined flexural plate wave devices: numerical simulation and experimental verification", IEEE Transactions on Ultrasonics, Ferroelectrics, and Frequency Control (vol. 47, Issue: 6), Nov. 2000, 1463-1471.

S Tadigadapa, et al., "Piezoelectric MEMS sensors: state-of-the-art and perspectives", Measurement Science and Technology vol. 20 No. 9 Meas. Sci. Technol. 20 092001 doi:10.1088/0957-0233/20/9/092001, 2009.

Sherrit, et al., "Comparison of the Mason and KLM Equivalent Circuits for Piezoelectric Resonators in the Thickness Mode", IEEE Ultrasonics Symposium, vol. 2, pp. 921-926, 1999.

Sherrit, et al., "Efficient Electromechanical Network Models for Wireless Acoustic-Electric Feed-throughs", Proceedings of the SPIE Smart Structures Conference, vol. 5758, pp. 362-372, Mar. 6-10, 2005.

Sherrit, et al., "Solid Micro Horn Array (SMIHA) for Acoustic Matching", Proceedings of SPIE, vol. 6932, pp. 1-9, 2008.

Sherrit, et al., "Studies of Acoustic-Electric Feed-throughs for Power Transmission Through Structures", Proceedings of SPIE, vol. 6171, pp. 1-8, 2006.

Sherrit, "The Physical Acoustics of Energy Harvesting", IEEE International Ultrasonics Symposium Proceedings, pp. 1046-1055, 2008.

Soeren Hirsch, et al., "A new device with PZT ultrasonic transducers in MEMS technology", Journal of Physics: Conference Series vol. 34; J. Phys.: Conf. Ser. 34 475 doi:10.1088/1742-6596/34/1/078, 2006.

Takashi Abe, et al., "Inverted Mesa-Type Quartz Crystal Resonators Fabricated by Deep-Reactive Ion Etching", IEEE Transactions on Ultrasonics, Ferroelectrics, and Frequency Control, vol. 53, No. 7, Jul. 2006, 1234.

International Search Report and Written Opinion dated Oct. 14, 2016 as received in Application No. PCT/US16/43421.

International Search Report dated Sep. 7, 2016 as received in Application No. PCT/US16/35887.

Written Opinion of the International Searching Authority dated Sep. 7, 2016 as received in Application No. PCT/US16/35887.

* cited by examiner

OSCILLATORS FOR WIRELESS POWER TRANSFER

CROSS-REFERENCE TO RELATED APPLICATIONS

This application claims the benefit of U.S. patent application Ser. No. 14/635,861, filed on Mar. 2, 2015, which claims the benefit of U.S. patent application Ser. No. 13/477,551, filed on May 22, 2012, which claims the benefit of U.S. Provisional Patent Application No. 61/490,988, filed May 27, 2011, all of which are herein incorporated herein by reference in its entirety. This application is also related to U.S. patent application Ser. No. 13/477,452, entitled, "Sender Communications for Wireless Power Transfer"; U.S. patent application Ser. No. 13/477,551, entitled "Receiver Communications for Wireless Power Transfer"; U.S. patent application Ser. No. 13/477,555, entitled "Sender Transducer for Wireless Power Transfer"; U.S. patent application Ser. No. 13/477,557, entitled, "Receiver Transducer for Wireless Power Transfer"; U.S. patent application Ser. No. 13/477,565, entitled, "Sender Controller for Wireless Power Transfer"; and U.S. patent application Ser. No. 13/477,574, entitled, "Receiver Controller for Wireless Power Transfer"; all of which were filed on May 22, 2012, and each and every one of which is incorporated herein in its entirety.

BACKGROUND

Devices that require energy to operate can be plugged into a power source using a wire. This can restrict the movement of the device and limit its operation to within a certain maximum distance from the power source. Even most battery-powered devices must periodically be tethered to a power source using a cord, which can be inconvenient and restrictive.

BRIEF SUMMARY

According to an embodiment of the disclosed subject matter, a system comprising at least one first transducer adapted and configured to convert electrical energy to ultrasonic energy in the form of ultrasonic waves. The first transducer is in communication with a first controller, and the first controller is in communication with a first communication device.

In another embodiment of the disclosed subject matter, a system comprises at least one second transducer adapted and configured to convert ultrasonic energy in the form of ultrasonic waves to electrical energy. The second transducer is in communication with a second controller, and the second controller is in communication with a second communication device.

Additional features, advantages, and embodiments of the disclosed subject matter may be set forth or apparent from consideration of the following detailed description, drawings, and claims. Moreover, it is to be understood that both the foregoing summary and the following detailed description are exemplary and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Embodiments of the disclosed subject matter can convert electrical energy into acoustic energy, which can be beamed to a device where it is converted back into electrical energy. The converted electrical energy can be used to power the device and to charge one or more energy storage components of the device, such as a battery, a capacitor, etc. This can obviate the need for constant or periodic tethering to a power source using a cord. Embodiments can transfer energy to several devices at once, in rotation or in any suitable sequence, with dwell times of any suitable duration.

Figure 1:
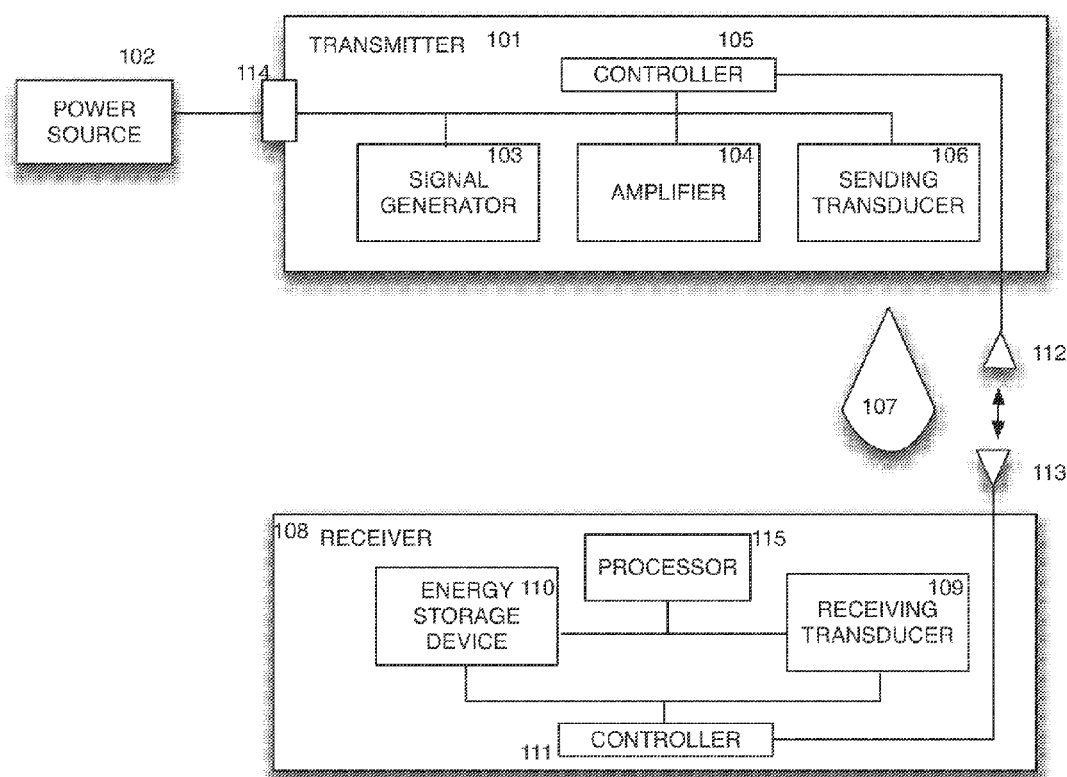
FIG. 1 shows a system in accordance with an embodiment of the invention.

FIG. 1 shows a system in accordance with the disclosed subject matter. Transmitter 101 can receive electrical energy from power source 102 (such as an electrical outlet or a battery) as input. Signal generator 103 can generate a signal that can be amplified by amplifier 104. This can be done under the control of controller 105. The amplified signal can be sent to sending transducer 106, and the ultrasonic energy in the form of ultrasound waves 107 can be transmitted through a medium such as the air. Receiver 108 can includes receiving transducer 109, which receives ultrasonic energy in the form of ultrasonic waves and converts it to electrical energy, which can be used to charge energy storage device 110 or power processor 111. Examples of energy storage device 110 can include a battery, a capacitor, an induction circuit, etc. Examples of device 105 can include a smartphone (such as an Android mobile device, an iPhone, a mobile device having a Microsoft operating system), a portable computer (such as an Apple laptop, a laptop having a Microsoft operating system, etc.), an electronic content reader, (such as the Amazon Kindle, the Apple iPad, etc.) and so on. Controller 111 can control the receiving transducer 109 and/or energy storage device 110.

Controller 105 can be coupled to antenna 112 and controller 111 can be coupled to antenna 113. As described below, the transmitter controller 105 and receiver controller 111 can communicate through antennas 112 and 113.

Sending transducer 106 can comprise a plurality of transducers arranged in an array that can produce a focused beam of ultrasonic energy. Sending transducer 106 may include at least one Capacitive Micro machined Ultrasonic Transducer (CMUT), a Capacitive Ultrasonic Transducer (CUT), an electrostatic transducer or any other transducer suitable for converting electrical energy into acoustic energy. To generate focused ultrasonic energy via a phased array, sending transducer 106 can include a timed delay transducer or a parametric array transducer, or a bowl-shaped transducer array. Transmitter 101 can operate for example between about 20 to about 120 kHz for transmission of ultrasonic energy through air, and up to about 155 dB, for example. For ultrasonic transmission through other medium, transmitter 101 can operate at frequencies greater than or equal to 1

MHz, for example. Sending transducer 106 may have a high electromechanical conversion, for example an efficiency of about 40%, corresponding to about a 3 dB loss.

Transmitter controller 105 can cause the sending transducer 106 to emit ultrasonic waves based on the proximity of the sending transducer 106 (or transmitter 101 in general) to receiving transducer 109. Receiving transducer 109 can convert ultrasonic energy received from sending transducer 106 to electrical energy. As used herein, proximity can be the actual or effective distance between the sending transducer 106 or the like and receiving transducer 109 or the like. Effective distance can be based on the efficiency of energy transmission between sending transducer 106 and receiving transducer 109 based on various factors that can include, without limitation, their relative locations; the characteristics of the conductive medium (e.g., the air, tissue, etc.) between transmitter and receiver; the relative orientation of the transmitter and receiver; obstructions that may exist between the transmitter and receiver; relative movement between transmitter and receiver; etc. In some cases, a first transmitter/receiver pair may have a higher proximity than a second transmitter/receiver pair, even though the first pair is separated by a greater absolute distance than the second pair.

Transmitter controller 105 may cause a beam of ultrasonic energy to be directed toward receiver transducer 109. Further, transmitter controller 105 can cause sending transducer 105 to emit ultrasonic waves having at least one frequency and at least one amplitude. Transmitter controller 105 can cause the sending transducer 106 to change the frequency and/or amplitude of at least some of the ultrasonic waves based on the proximity and/or location of sending transducer 106 to receiving transducer 109. Additionally, transmitter controller 105 can cause sending transducer 105 to change the amplitude of at least some of the ultrasonic waves based on the frequency of the ultrasonic energy emitted by sending transducer or based on information regarding the receipt of ultrasonic energy as determined by receiving controller 111.

Sending controller 105 and receiving controller 111 can communicate through antennas 112 and 113. In this way, receiving controller can essentially control the character and amplitude of the energy generated by sending transducer 106 by sending commands to sending controller 105. Also, sending controller 105 can control the characteristics of sending transducer 106 based upon data and/or commands received from receiving controller 111. Likewise, sending controller can control the characteristics of the energy sent by sending transducer 106 independently of input from receiving controller 111.

Transmitter controller 105 can include a transmitter communications device (not shown) that can send an interrogation signal to detect receiving transducer 109. The transmitter communications device can send a control signal to a receiver communications device (not shown) coupled to receiver controller 111. Receiver controller 111 can control receiver transducer 109. The control signal may include the frequency and/or amplitude of the ultrasonic energy emitted by sending transducer 106. The control signal can be used to determine the proximity and/or orientation of sending transducer 106 to receiving transducer 109. Additionally, the control signal may include an instruction to be executed by receiving controller 109 and may also include information about the impedance of sending transducer 106.

The sender communication device can receive a control signal from the receiver communication device, which can be in communication with receiver controller 111. The control signal may include a desired power level, the frequency and/or amplitude of ultrasonic energy received from the sender transducer 106. Additionally, the control signal may include the impedance of the receiving transducer 109, a request for power, and/or an instruction to be executed by the transmitter controller 105. The control signal may be used to determine the proximity of the sender transducer to the receiver transducer and/or the relative orientation of the sender transducer to the receiver transducer. Further, the control signal may also indicate a power status. Such a power status can indicate, for example, the amount of power available to the receiver 108, e.g., percent remaining, percent expended, amount of joules or equivalent left in the receiver energy storage device 110. The control signal may be transmitted by modulating at least some of the ultrasonic waves and/or may be transmitted out-of-band, e.g., using a separate radio frequency transmitter, or by sending a signal through a cellular telephone network or via a Wi-Fi network. For example, the signal may be transmitted by text, instant message, email, etc.

Transmitter 101 can further include a signal generator 103, variously known as a function generator, pitch generator, arbitrary waveform generator, or digital pattern generator, which can generate one or more waveforms of ultrasonic waves. A controller 105 can itself include an oscillator, an amplifier, a processor, memory, etc., (not shown.) The processor of the controller can also execute instructions stored in memory to produce specific waveforms using the signal generator 103. The waveforms produced by the signal generator 103 can be amplified by the amplifier 104. The controller 105 can regulate how and when the transducer 106 can be activated.

The electrical power source 102 for transmitter 101 may be an AC or DC power source. Where an AC power source is used, transmitter 101 may include a power processor 114 that is electrically connected with the signal generator 103. The power processor 114 can receive AC power from the power source 102 to generate DC power.

Transmitted ultrasound beams 107 can undergo constructive interference and generate a narrow main lobe and low-level side lobes to help focus and/or direct the ultrasonic energy. The ultrasonic energy generated by transmitter 101 may also be focused using techniques such as geometric focusing, time reversal methods, beam forming via phase lags, or through the use of an electronically controlled array.

The transmitter 101 may scan an area for receivers, may sense location of a receiver within a room, may track a receiver, and may steer an ultrasonic beam toward the receiver. Transmitter 101 may optionally not emit ultrasonic energy unless a receiver 108 is determined to be within a given range.

Transmitter 101 may be mechanically and/or electronically oriented towards a receiver 108. For example, in some embodiments, the transmitter can be tilted in the XY-direction using a motor and the beam can be steered electronically in the Z-direction. The transmitter 101 may transmit ultrasonic energy to the receiver 108 via line of sight transmission or by spreading the ultrasound pulse equally in all directions. For line of sight transmission, the transmitter 101 and receiver 108 may be physically oriented toward each other: the transmitter 101 can physically or electronically (or both) be aimed at the receiver 108 or the receiver 108 can be so aimed at the transmitter 101. The transmitter 101 may transmit signals, such as an ultrasonic, radio, or other such signal, to be sensed by the receiver 108 for the purpose of detecting orientation, location, communication, or other purposes, or vice versa. One or both of the transmitter 101 and receiver 108 can include a signal receiver such as antennas 112 and 113, respectively, that can receive signals from the receiver 108 or transmitter 101, respectively. Likewise, signals may be transmitted from transmitter 101 to receiver 108 using the ultrasonic waves themselves.

The transmitter 101 can be thermo regulated by managing the duty cycles of the signal generator and other components. Thermoregulation can also be achieved by attaching heat sinks to the transmitting transducer 106, using fans, and/or running a coolant through the transmitter, and other thermoregulation methods.

Receiver 108 can include a receiver transducer 109 that can convert ultrasonic energy in the form of ultrasonic waves to electrical energy. Receiver transducer 109 may include one or more transducers arranged in an array that can receive unfocused or a focused beam of ultrasonic energy. Receiver transducer 108 may include at least one Capacitive Micromachined Ultrasonic Transducer (CMUT), a Capacitive Ultrasonic Transducer (CUT), or an electrostatic transducer, or a piezoelectric-type transducer described below, a combination thereof or any other type or types of transducer that can convert ultrasound into electrical energy. For receiving focused ultrasonic energy via a phased array, receiver transducer 109 may include a timed delay transducer or a parametric transducer. Receiver 108 can operate for example between about 20 to about 120 kHz for receipt of ultrasonic energy through air, and up to about 155 dB, for example. For receiving ultrasonic energy through other medium, receiver 108 can operate at frequencies greater than or equal to 1 MHz, for example. Receiver transducer 109 can have a high electromechanical conversion efficiency, for example of about 40%, corresponding to about a 3 dB loss.

Receiver transducer 109 may supply electrical energy to an energy storage device 110 and/or a processor 115. Examples of an energy storage device 110 can include, but are not limited to, a battery, a capacitive storage device, an electrostatic storage device, etc. Examples of a processor can include, but not limited to, a processor or chipset for a smartphone (such as an Android mobile device, an iPhone, a mobile device having a Microsoft operating system), a portable computer (such as an Apple laptop, a laptop having a Microsoft operating system, etc.), an electronic content reader, (such as the Amazon Kindle, the Apple iPad, etc.) and so on.

In accordance with various embodiments, receiver 108 can include a receiver transducer 109 that can be one or more of a piezoelectrically actuated flexural mode transducer, a flextensional transducer, a flexural mode piezoelectric transducer, and/or a Bimorph-type piezoelectric transducer ("PZT") such as flexing type piezoelectric element of the kind manufactured by Morgan Electro Ceramics. These can be attached to a metal membrane and the structure can resonate in a flexing mode rather than in a brick mode. In embodiments, the structure can be clamped around the rim by an attachment to the transducer housing. The PZT slab can be electrically matched to the rectifier electronics. This can be a high Q resonator (it can resonate at a single frequency) that can be held by very low impedance material.

Receiver 108 can further include a receiver controller 111 in communication with the receiver transducer 109. Receiver controller 109 can cause the receiver transducer 109 to receive ultrasonic waves based on the proximity of the receiver transducer 109 to a sender transducer 106. Receiver transducer 109 can convert ultrasonic energy received from a sender transducer 106 to electrical energy. Proximity can be the actual or effective distance between the receiver transducer 109 and sender transducer 106. Effective distance can be based on the efficiency of energy transmission between receiver transducer 109 and sender transducer 106 based on various factors that can include, without limitation, their relative locations; the characteristics of the conductive medium (e.g., the air, tissue, etc.) between transmitter and receiver; the relative orientation of the transmitter and receiver; obstructions that may exist between the transmitter and receiver; relative movement between transmitter and receiver; etc. In some cases, a first transmitter/receiver pair may have a higher proximity than a second transmitter/receiver pair, even though the first pair is separated by a greater distance than the second pair.

Receiver controller 109 may cause a beam of ultrasonic energy to be received from sender transducer 106. Further, receiver controller 109 can cause the sender transducer 106 to receive ultrasonic waves having at least one frequency and at least one amplitude.

Receiver 108 can further include a communication device (not shown) that can send an interrogation signal through antenna 113 to detect transmitter 101 and help to determine characteristics of transmitter 101, including sending transducer 106. The receiver communication device can send a control signal to a sender communication device, which can be in communication with sender controller 105. Sender controller 105 can control sender transducer 106. The control signal may include the frequency and/or amplitude of the ultrasonic waves received by receiver transducer 109. The control signal may be used to determine the proximity and/or relative orientation of receiver transducer 109 to sender transducer 106. Additionally, the control signal may include, without limitation, an instruction to be executed by sender controller 105; the impedance of receiver transducer 109; a desired power level; a desired frequency, etc.

The receiver communications device may receive a control signal from a sender communications device that can be in communication with sender controller 105. The control signal may include the frequency and/or amplitude of ultrasonic energy emitted by sender transducer 106. Additionally, the control signal may include an instruction to be executed by receiver controller 111 and may also include an interrogation signal to detect a power status from receiver transducer 109. The control signal may be used to determine the proximity and/or relative orientation of receiver transducer 109 to sender transducer 106.

A communications device can send a signal by modulating the ultrasonic waves generated by the transducer for in-band communications. The communication device can also be used to modulate an out-of-band signal, such as a radio signal, for communication to another communication device. The radio signal can be generated by a separate radio transmitter that may use an antenna.

The system may include communication between receiver and transmitter to, for example, adjust frequency to optimize performance in terms of electro acoustical conversion, modulate ultrasonic power output to match power demand at a device coupled to the receiver, etc. For example, if it is determined that the ultrasound waves received by the receiver 108 are too weak, a signal can be sent through the communications devices to the transmitter 101 to increase output power. Sender controller 105 can then cause sending transducer 106 to increase the power of the ultrasonic waves being generated. In the same way, the frequency, duration, and directional characteristics (such as the degree of focus) of the ultrasonic waves may be adjusted accordingly.

Thus, in accordance with embodiments of the disclosed subject matter, the transmitter 101 and receiver 108 can communicate to coordinate the transmission and receipt of ultrasonic energy. Communications between the transmitter 101 and receiver 108 can occur in-band (e.g., using the ultrasonic waves that are used to convey power from the transmitter to the receiver to also carry communications signals) and/or out-of-band (e.g., using separate ultrasonic waves from those used to carry power or, for example, radio waves based on a transmitter or transceiver at the transmitter and receiver.) In an embodiment, a range detection system (not shown) can be included at the transmitter 101, at the receiver 108 or both. The range detection system at the transmitter can use echolocation based on the ultrasound waves sent to the receiver, the Bluetooth wireless communications protocol or any other wireless communications technology suitable for determining the range between a device and one or more other devices. For example, the strength of a Bluetooth or Wi-Fi signal can be used to estimate actual or effective range between devices. For example, the weaker the signal, the more actual or effective distance can be determined to exist between the two devices. Likewise, the failure of a device to establish a communications link with another device (e.g., using a Bluetooth or Wi-Fi (e.g., 802.11) signal with another device can establish that the other device is beyond a certain distance or range of distances from a first device. Also, a fraction of the waves can reflect back to the transmitter from the receiver. The delay between transmission and receipt of the echo can help the transmitter to determine the distance to the receiver. The receiver can likewise have a similar echolocation system that uses sound waves to assess the distance between the receiver and the transmitter.

In an embodiment of the presently disclosed subject matter, impedance of the first 106 and second 109 transducers may be the same and/or may be synchronized. In this regard, for example, both transducers 106 and 109 may operate at the same frequency range and intensity range, and have the same sensitivity factor and beam width.

Communications between transmitter 101 and receiver 108 can also be used to exchange impedance information to help match the impedance of the system. Impedance information can include any information that is relevant to determining and/or matching the impedance of the transmitter and/or receiver, which can be useful in optimizing the efficiency of energy transfer. For example, a receiver 108 can send impedance information via a communication signal (e.g., a "control signal") that includes a frequency or a range of frequencies that the receiver 108 is adapted to receive. The frequency or range of frequencies may be the optimal frequencies for reception. Impedance information can also include amplitude data from the receiver 108, e.g., the optimal amplitude or amplitudes at which a receiver 108 can receive ultrasound waves. In an embodiment, an amplitude is associated with a frequency to identify to the transmitter 101 the optimal amplitude for receiving ultrasound at the receiver 108 at the specified frequency. In an embodiment, impedance information can include a set of frequencies and associated amplitudes at which the receiver 108 optimally can receive the ultrasound waves and/or at which the transmitter 101 can optimally transmit the ultrasound. Impedance information can also include information about the sensitivity of the transmitter 101 and/or receiver 108, beam width, intensity, etc. The sensitivity may be tuned in some embodiments by changing the bias voltage, at least for embodiments using CMUT technology.

Communications can also include signals for determining location information for the transmitter 101 and/or the receiver 108. In accordance with embodiments of the disclosed subject matter, location information for receivers 108 can be associated with receiver identifiers (e.g., Electronic Identification Numbers, phone numbers, Internet Protocol, Ethernet or other network addresses, device identifiers, etc.) This can be used to establish a profile of the devices at or near a given location at one time or over one or more time ranges. This information can be provided to third parties. For example, embodiments of the system may determine a set of device identifiers that are proximate to a given location and to each other. The fact that they are proximate; the location at which they are proximate; information about each device (e.g., a device's position relative to one or other device, a device's absolute location, power information about a device, etc.) can be shared with a third party, such as an third party application that would find such information useful. Further, similar such information can be imported into embodiments of the present invention from third party sources and applications.

Embodiments of communications protocols between transmitter 101 and receivers 108 can be used to dynamically tune the beam characteristics and/or device characteristics to enable and/or to optimize the transmission of power from transmitter 101 to receiver 108. For example, at a given distance, it may be optimal to operate at a given frequency and intensity. A transmitter 101 may server several different devices by, for example, steering and tuning the beam for each receiver device 108, e.g., in a round-robin or random fashion. Thus, the beam for a device A may be at 40 kHz and 145 dB, device B may be at 60 kHz and 130 dB and device C at 75 kHz and 150 dB. The transmitter can tune itself to transmit an optimally shaped beam to each of these dynamically, changing beam characteristics as the transmitter shifts from one device to another. Further, dwell time on each receiver device 108 can be modulated to achieve particular power transfer objectives.

In an embodiment, a transmitter 101 can receive a signal (one or more control signals) from a receiver 108 indicating one or more of the receiver's distance, orientation, optimal frequencies, amplitudes, sensitivity, beam width, etc. For example, optimal frequency when a receiver is less than 1 foot away from a transmitter may be 110 kHz with a 1.7 dB/ft attenuation rate, and optimal frequency when a receiver is farther than 1 foot away from a transmitter may be 50 kHz with a 0.4 dB/foot attenuation rate. The receiver can detect the distance and provide a signal to the transmitter to change its frequency accordingly. In response, the transmitter can tune itself to transmit the best beam possible to transfer the most power in the most reliable fashion to the receiver. These parameters can be dynamically adjusted during the transmission of ultrasonic energy from the transmitter to the receiver, e.g., to account for changes in the relative positions of the transmitter and receiver, changes in the transmission medium, etc.

Likewise, a receiver 108 may configure itself in response to signals received from a transmitter 101. For example, a receiver 108 may tune to a given frequency and adjust its sensitivity to most efficiently receive and convert ultrasound waves from the transmitter 101 to electrical energy.

Dwell time of a transmitter 101 on a receiver 108 can also be adjusted to optimize the energy delivered by a transmitter to several receivers around the same time. For example, the transmitter 101 may receive power requirements information from each of five receivers. It may dwell on the neediest receiver for a longer time interval than a less needy receiver as it services (e.g., sends ultrasound waves to) each receiver, e.g., in round-robin fashion.

Embodiments of the present invention include a system that can include a sender transducer coupled to the amplifier. The sender transducer can be a capacitive micromachined ultrasound transducer, another type of capacitive ultrasound transducer, an electrostatic ultrasound transducer, a piezoelectric type ultrasound transducer, etc. A capacitive transducer includes any transducer that converts any capacitively-stored energy into ultrasonic energy. An electrostatic transducer is one that uses any electrostatically-stored energy into ultrasound energy. A piezoelectric-type transducer is one that generates ultrasonic energy based on subjecting dielectric crystals to mechanical stress.

The transducer can be configured as an array of transducers and/or apertures. This can be used to produce a beam of ultrasonic energy. The transducer can be controlled by the sender controller to produce one or more ultrasonic beams and can produce each such beam or combination of beams with a given shape, direction, focal length and any other focal property of the beam. The transducer can include one or more steering components, including one or more electronic steering components, e.g., one or more configurations or patterns or array elements and/or apertures. One or more of the apertures can be convex to help control beam properties such as focal length. A transducer can have a mechanical steering component that works alone or in combination with one or more electronic steering components to control focal properties of one or more ultrasonic beams.

In accordance with embodiments of the present invention, a system can include a sender that has a first value of a configuration parameter. A configuration parameter can be used to describe an actual or potential state or condition of a sender or a receiver and can include, for example, an amplitude, a frequency, a steering parameter, an instruction, a power status, a transmitter characteristic and a receiver characteristic. A sender characteristic can describe an actual or potential condition of the sender or receiver. For example, a sender characteristic can relate to the power state of the sending transducer and have the values ON (emitting ultrasound to be converted into electrical energy by a receiver) or OFF. Another power configuration parameter can relate to the power level of the emitted ultrasonic energy in various units, such as watts per square inch, decibels, etc.

A characteristic can describe an actual or potential condition of the sender or receiver that can be fixed. For example, a characteristic can be a telephone number, Electronic Serial Number (ESN), Mobile Equipment Identifier (MEID), IP address, MAC address, etc., or a mobile or stationary device that can be a sender or receiver. A characteristic can be a fixed impedance or other electronic property (e.g., transducer type, software/firmware version, etc.) of a device.

In accordance with embodiments of the present invention, a device has a first configuration parameter. Based on input received through the sender communications device, the sender can change its configuration parameter value to a second configuration parameter value and thereby change its state and/or behavior. Mechanisms for changing the sender configuration parameter can include receiving a new configuration parameter value through the communications device. The new configuration parameter value can originate from a receiver to which the sender is or intends to transmit ultrasonic energy. For example, a sender can be transmitting ultrasonic energy at a first power level and a receiver can send a message to the sender requesting that the energy be transmitted at a second power level. For example, a receiver can send a request asking that the power of transmitted ultrasound be boosted from 120 dB to 140 dB. The sender can then change its power level configuration parameter from 120 dB to 140 dB.

Another mechanism is to change a first configuration parameter based on input received through the communications device, even when that input does not specify a new (second) value for the configuration parameter. For example, input can be received at the sender communications device from a receiver that includes a request to increase the power of the transmitted ultrasonic energy. In response, the sender can change the value of the power configuration parameter from the first value to a second value, e.g., from 120 dB to 140 dB. Likewise, one or more configuration parameters can be changed based on a combinations of inputs from one or more receivers or third parties. For example, a beam shape can be changed based upon a receiver characteristic, such as the type of receiver transducer at the receiver.

A configuration parameter can be or include one or more steering parameters. Examples of steering parameters include a steering angle, such as the angle at which a mechanical tilt device has disposed or can disposed one or more elements of a transducer; a dispersion angle, such as the angle at which a threshold power occurs in an ultrasonic beam (e.g., the beam width expressed as an angle); a focal length, such as a distance in centimeters at which an ultrasonic beam becomes most focused; a transmitter location, such as the angle and distance of a receiver from a transmitter, or the distance of a transmitter from a receiver, or the absolute position (e.g., from a given reference point) of a sender or receiver; and a relative orientation of a sender and receiver, such as the difference in the relative orientation of a sender transducer and a receiver transducer, expressed in the degrees from parallel. For example, when one transducer is parallel to another, they can be said to have a zero degree offset. When one is perpendicular in orientation to another, they can have a ninety degree offset, etc.

Another mechanism is to change a first steering parameter in order to adjust and/or improve the efficiency of the transmission of ultrasonic energy to a receiver. The steering parameter can be changed based on input received through the communications device, even when that input does not specify a new (second) value for the steering parameter. For example, input can be received at the sender communications device from a receiver that includes an amount of the transmitted ultrasonic energy being received, e.g., 120 dB. In response, the sender can change the value of the steering parameter, e.g., relative orientation, from the first value to a second value, e.g., from a ninety degree offset to a zero degree offset. As a result of changing/adjusting the steering parameter, the efficiency of the transmission of ultrasonic energy to the receiver may improve, and the amount of the transmitted ultrasonic energy being received may increase, e.g., from 120 dB to 140 dB. For example, the amount of power at the receiver can be monitored by the receiver and used as a basis for generating an input to be sent to the sender to adjust one or more of its configuration parameters. This can change the way in which ultrasonic energy is transmitted by the sender to the receiver, e.g., by changing the tilt of a mechanical steering mechanism for the sender transducer, by changing the power level of the transmitted ultrasonic energy, by changing the electronic steering and beam shaping of the ultrasonic energy at the sender, etc. In this way, the receiver can provide real-time or near-real-time feedback to the sender so that the sender can tune the way in which it sends ultrasonic energy to the receiver to improve the rate at which energy is transferred (e.g., power), the continuity of energy transfer, the duration of energy transfer, etc.

Beam steering and focusing can be achieved by causing the controller to modulate (control) the phase of the electrical signal sent to the sending transducer or to various elements of the sending transducer. For wide-angle steering, elements of size λ/2 can be used, e.g., having a size of around 4 mm. Some semiconductor companies (Supertex, Maxim, Clare, etc.) manufacture high voltage switch chips that can allow a few high-power oscillator circuits to take the place of thousands of transmitters. An example of a useful design can have four oscillators with phases of 0, π/2, π and 3π/2. Switches can be arranged so that each transmit element can be connected to any of the four phases. The pitch of the switch-matrix can then be smaller than the pitch of the transducer array, which can facilitate interconnection. A small amount of memory can store the entire set of switch arrangements needed for an arbitrary number of steering and focusing positions. A simple microcontroller (e.g., an ARM microcontroller) can manage the steering/focusing computation.

Beam steering and focusing can be made more manageable in various ways. An electronic steering mechanism can be combined with a mechanical tilt mechanism in a direction orthogonal to that of the electronic steering mechanism to steer and focus the beam. For example, the transmitter can be relatively fixed in azimuth (horizontal dimension) but mechanically steerable in elevation (vertical dimension). Tracking vertically can be achieved by a mechanical tilt, driven by the signaling from the receiver, or from a transmitter, either directly or through the receiver, or with input from both and/or a third party, such as a power-tracking server. Electronic steering and focusing can be used for the azimuthal (horizontal) beam.

Some embodiments can tilt in both azimuth and elevation. In such cases, a two dimensional array with certain elements (e.g., a 15×15 array of 2λ elements) can perform focusing and steering. In some embodiments, the element size can grow from λ/2 to 2λ or larger. In some embodiments, the electronically steered array can be embedded in a mechanically focused transducer. A smaller matrix array can be positioned at the center of curved transducer. The curvature can create a focus in a given direction and at a certain average depth, e.g., one meter. The electronically focusing portion in the center can further adjust the focusing characteristics of the beam.

Figure 2:
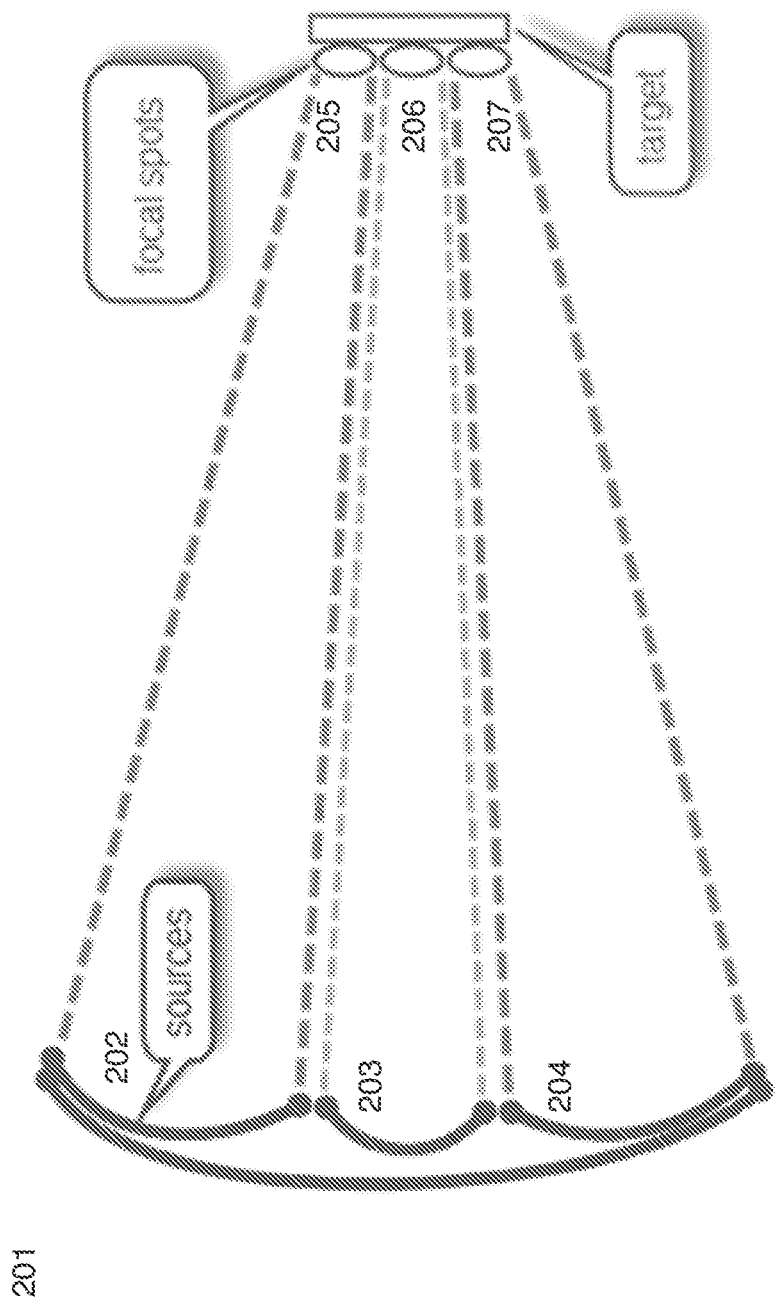
FIG. 2 shows a system in accordance with an embodiment of the invention.

In some embodiments, the output can be split asymmetrically between azimuth and elevation, allowing for sophisticated beam control. In various embodiments, the aperture can be divided into several sub-apertures. Some or all of the sub-apertures can have different steering capabilities, enabling such an arrangement to produce a plurality of foci, which may be adjacent to each other. FIG. 2 shows a divided aperture apparatus in accordance with embodiments of the present invention. Source aperture 201 of can be divided into separate sub-apertures 202, 203 and 204. Each sub-aperture 202, 203 and 204 has its own target focus 205, 206 and 207, respectively. The phase of each of the three sources shown in FIG. 2 can be altered to change the focal length of the elevation aperture. The beam steering can be mechanical, electronic, or a combination of the two. This arrangement can also be focused by changing the phase between the sources. The efficiency of the transmitter can be maintained for targets over a range of depths around the mechanical foci established by the curvature of the sources.

Figure 3:
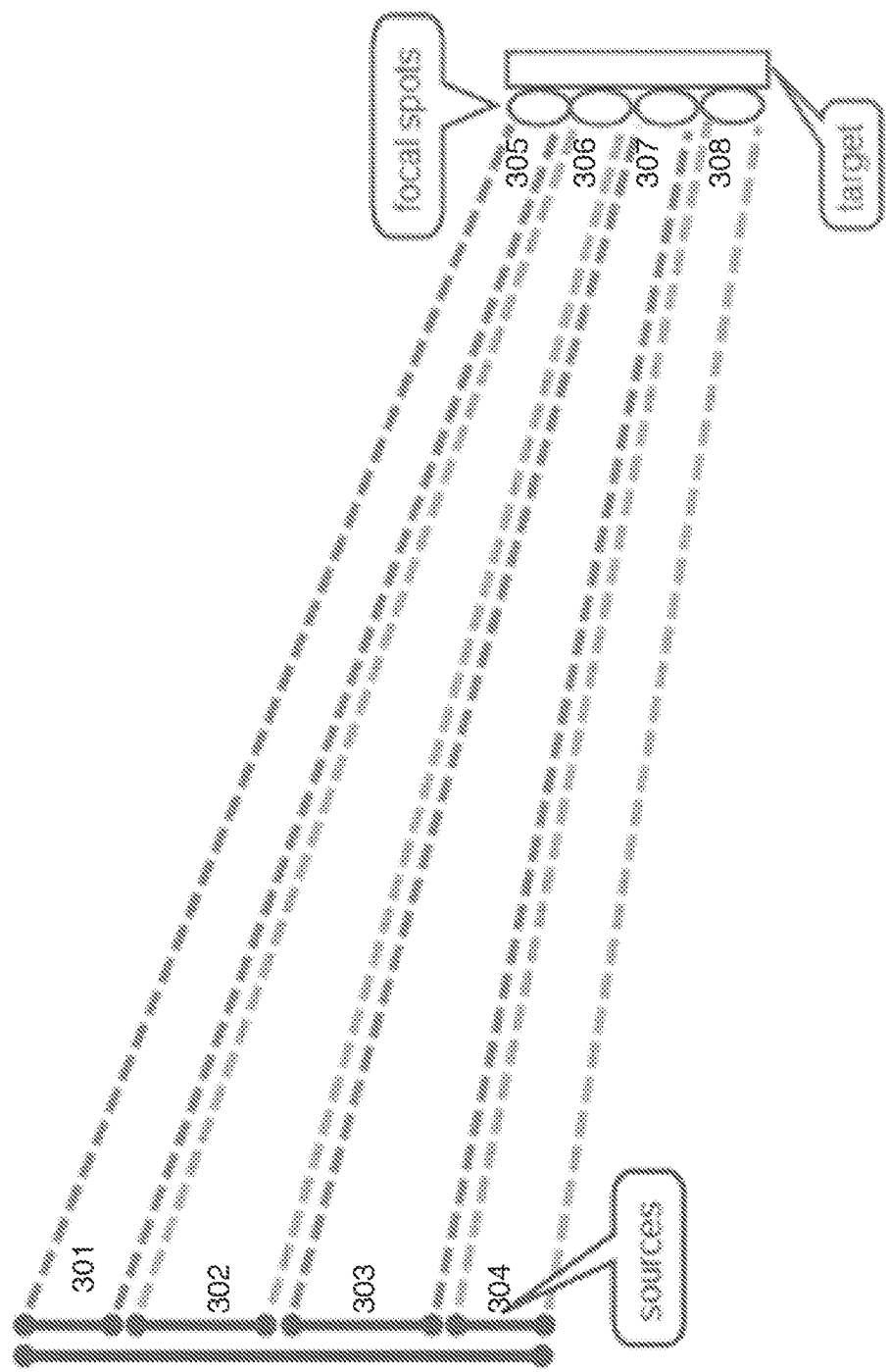
FIG. 3 shows a system in accordance with an embodiment of the invention.

FIG. 3 shows another focusing apparatus that uses azimuth aperture division to allow for an extended focus range over the target. Source targets 301, 302, 303 and 304 have respective target foci 305, 306, 307 and 308. Steering and focusing can be accomplished electronically, mechanically, or a combination thereof. In the embodiment shown in FIG. 3, the element size can be made small enough to avoid the need for aperture curvature and/or mechanical tilt. Dividing the array into segments can increase the size of the focal spots and allow them to be juxtaposed. The foci can move around on the surface of the receiver, e.g., to optimize the overall power transfer.

A mobile device application (e.g., an iPhone or Android application) may be associated with an embodiment of the present system to aid the user. The associated mobile application may locate an ultrasonic power system, in accordance with an embodiment of the disclosed subject matter, near or within range of the user's location. The mobile application may pinpoint the user's exact location and compare it to the strongest power signal location in the room, and direct the user to that power location. The mobile application may communicate with corresponding applications on other mobile devices, e.g., to share location information, transmitter and/or receiver information, data about the transmissivity of a given medium, etc.

In accordance with embodiments of the present invention, a given device may act as essentially as a relay between an initial transmitter and a terminal receiver device. Such a device (a "relay device" or an "intermediate device") may receive power from a first device, convert at least a part of the received power to electrical energy, re-convert it to acoustic energy and then beam that acoustic energy to the terminal receiver device. This can be useful when the terminal device may be out of range of the initial transmitter device, especially when the initial transmitter device stores a substantial amount of energy or is connected to a larger source of energy, such as an electrical outlet or a large external battery. This can also be used to arrange for a transfer energy from a device that has sufficient or an excess amount of stored energy to a device in need of energy, even when the latter may be out of range of the former without a relay or intermediate device.

The mobile application may also inform the user of how quickly its mobile application device is being charged and how much more power and/or time the device requires until it's fully charged. Additionally, the mobile application can indicate the user's "burn rate" based on the amount of data being used on the device at a given time based on a variety of factors, for example, how many programs/applications are open and can indicate that the device will need to charge again in a given time period. The mobile application may tell the user when the device is using power from the device battery or power from the wireless power system. For example, the mobile application may have a hard or soft switch to signal the transmitter when the device battery is less than 20% full, thereby reducing the use of dirty energy and allowing the system to supply the most power to those who need it to the most. Additionally, the user may have the ability to turn off their ultrasonic receptor and/or transmitter using the mobile application.

At least part of the receiver 108 may be in the shape of a protective case, cover, or backing for a device, such as a cell phone, that may be inside or outside the physical device. An energy storage device, such as a rechargeable battery, may be embedded within the receiver case. The receiver 108 may also be used in other devices such as a laptop, tablet, or digital reader, for example in a case or backing therefor. The receiver 108 may be embedded within the electronic housing or can be a physical attachment. The receiver 108 can be any shape or size and can function as an isolated power receiver or be connected to a number of devices to power them simultaneously or otherwise.

In an embodiment of the disclosed subject matter, the receiver 108 can be a medical device such as an implant, for example a pacemaker, or drug delivery system. The implant can be powered, or the storage device can be charged, using an ultrasonic transmitter 101. The characteristics of the transmitter 101 and/or receiver 108 can be tuned taking into account the power needs of the device, the conduction parameters of the tissue between the transmitter 101 and receiver 108, and the needs of the patient. For ultrasonic power transmission through animal or plant tissue, the receiver 108 can be embedded in a medical device and/or tissue to power or charge a chemical deliver or medical device such as an implanted device. For example, a transmitter 101 could be programmed to emit ultrasound waves at a given time to a receiver 108 located within a pacemaker device implanted in the body of a patient.

Certain embodiments of the present invention can be designed to deliver a relatively uniform pressure to a rectangle such as a surface of, on or in a mobile device. For example, an embodiment can be designed to deliver acoustic energy to a mobile device such as a smartphone of size 115×58 mm at a distance of one meter from the transmitter with a transmit frequency in the range of 40-60 kHz (i.e. the wavelength can be 5.7 to 8.5 mm.)

The maximum power in some embodiments from transmitter to receiver can be 316 W·m$^{-2}$, while the normalized amplitude or "gain" can be characterized as the pressure created from 1 Pa at the surface of the transmitter. A gain of less than one could mean that the energy transfer is less than ideal. A gain above one could mean that the power density at the transmitter should be reduced, e.g., for regulatory compliance, which may also be less than ideal. A design could create a gain of one, constant over the receiver area, and a gain less than one everywhere else. The system can track the motion of the phone and limit power loss in the face of relative motion and/or position change of the transmitter in relation to the receiver and/or vice versa.

Phase change across the phone can be minimized, even in view of changes in the angle between the plane of the transmitter and receiver, which can be facilitated by using separate receiver patches on the phone and/or with a multi-element transmitter, which can also raise the overall efficiency through better control of the acoustic field. Steering and focusing can be achieved electronically by varying the phase of the transmitter wave across the elements. Different steering angles and focus depths can have different values of phase at each element.

Various embodiments of the present invention can track the relative position and orientation of a transmitter and receiver, e.g., through an iOS or Android application and a wireless protocol such as Bluetooth or 802.11. Closed-loop communication between transmitter and receiver can permit the transmit beam to track the mobile device to minimize the phase changes of the beam across an element on or in the receiver.

When a receiver arrives within range of a transmitter, a two-way communication can be initiated. The receiver can signal its location and request transmission of acoustic power. As charging takes place, the phone can updates the transmitter about its location, the amount of power received and the distribution of acoustic energy at the receiver. An alert can be sent if the receiver is positioned in an orientation or location where the power transfer is inefficient. The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A system, comprising:
   a sender comprising:
      a first signal generator;
      a first amplifier coupled to the first signal generator, said first amplifier configured to receive power from a power source and to generate an electrical transmission signal adapted to be used to generate ultrasonic waves;
      a sender transducer coupled to the first amplifier, the sender transducer adapted and configured to generate ultrasonic waves based on the electrical transmission signal received from the amplifier, the sender transducer comprising at least one transmit element;
      a sender controller coupled to at least one of the first signal generator, the first amplifier and the sender transducer;
      at least one switch coupled to the at least one transmit element of the sender transducer, the at least one switch adapted and configured to select an oscillator circuit for the at least one transmit element;
      at least four oscillator circuits coupled to the at least one switch, each of the at least four oscillator circuits adapted to modulate the phase of the electrical transmission signal; and
      a sender communications device adapted to communicate with a receiver communications device; and
   the receiver comprising:
      a receiver transducer adapted and configured to receive ultrasonic waves generated by the sender transducer, to generate a receiver electrical signal based on the received ultrasonic waves, and to connect to a receiver electrical storage device adapted and configured to store electrical energy based on the receiver electrical signal generated by the receiver transducer;
      a receiver communications device adapted and configured to send input to the sender communications device; and
      a receiver controller coupled to at least one of the receiver transducer and the receiver electrical storage device.

2. The system of claim 1, wherein the receiver further comprises:
   a receiver electrical storage device adapted and configured to store electrical energy based on the receiver electrical signal generated by the receiver transducer.

3. A system, comprising:
   a signal generator;
   an amplifier coupled to the signal generator, said amplifier configured to receive power from a power source and to generate an electrical transmission signal adapted to be used to generate ultrasonic waves;
   a sender transducer coupled to the amplifier, the sender transducer adapted and configured to generate ultrasonic waves based on the electrical transmission signal received from the amplifier, the sender transducer comprising at least one transmit element;
   at least one switch coupled to the at least one transmit element of the sender transducer, the at least one switch adapted and configured to select an oscillator circuit for the at least one transmit element;

at least four oscillator circuits coupled to the at least one switch, each of the at least four oscillator circuits adapted to modulate the phase of the electrical transmission signal; and a sender controller coupled to at least one of the signal generator, the amplifier and the sender transducer; and a sender communications device adapted to communicate with a receiver.

4. The system of claim 3, wherein the at least one switch comprises a high voltage switch chip.

5. The system of claim 3, wherein the at least four oscillator circuits comprise a first oscillator circuit with a phase of 0, a second oscillator circuit with a phase of $\pi/2$, a third oscillator circuit with a phase of $\pi$, and a fourth oscillator circuit with a phase of $3\pi/2$.

6. The system of claim 3, wherein the phase of an ultrasonic wave generated by the at least one transmit element of the sender transducer is the phase of the one of the at least four oscillators selected for the at least one transmit element by the at least one switch.

7. The system of claim 3, wherein the at least one switch and the at least four oscillators steer the ultrasonic waves generated by the sender transducer.

8. The system of claim 3, wherein the at least one switch and the at least four oscillators focus the ultrasonic waves generated by the sender transducer.

9. The system of claim 3 comprising additional switch elements and additional transmit elements, wherein any of the at least four oscillators can be selected for the at least one transmit element and each of the additional transmit elements by one or more of the at least one switch element and the additional switch elements.

10. The system of claim 3, wherein an oscillator circuit selected for a transmit element by a switch element is connected to the transmit element by the switch element.

11. The system of claim 3, wherein the at least one switch is part of a switch matrix, the transmit element is part of a transducer array, and wherein the pitch of the switch matrix is equal to or smaller than the pitch of the transducer array.

12. A system, comprising:
a signal generator;
an amplifier coupled to the signal generator, said amplifier configured to receive power from a power source and to generate an electrical transmission signal adapted to be used to generate ultrasonic waves;
a sender transducer coupled to the amplifier, the sender transducer adapted and configured to generate ultrasonic waves based on the electrical transmission signal received from the amplifier, the sender transducer comprising a transducer array of transmit elements;
a switch-matrix comprises switches coupled to the transmit elements of the sender transducer, the switches adapted and configured to select, for each of the transmit elements, an oscillator circuit;
at least four oscillator circuits coupled to the switches of the switch-matrix, each of the at least four oscillator circuits adapted to modulate the phase of the electrical transmission signal; and
a sender controller coupled to at least one of the signal generator, the amplifier and the sender transducer; and
a sender communications device adapted to communicate with a receiver.

13. The system of claim 12, wherein the at least four oscillator circuits comprise a first oscillator circuit with a phase of 0, a second oscillator circuit with a phase of $\pi/2$, a third oscillator circuit with a phase of $\pi$, and a fourth oscillator circuit with a phase of $3\pi/2$.

14. The system of claim 12, wherein the switches of the switch-matrix and the at least four oscillator circuits steer and focus the ultrasonic waves generated by the sender transducer.

15. The system of claim 12, wherein the pitch of the switch matrix is equal to or smaller than the pitch of the transducer array.

16. A method comprising:
selecting a switch arrangement associated with one or both of a steering position and a focusing position for a switch-matrix; and
switching switches in the switch-matrix in accordance with the selected switch arrangement to connect at least one transmit element to one of at least four oscillators;
modulating a phase of an electrical transmission signal from an amplifier with the one of the least four oscillators circuits; and
emitting from the transmit element an ultrasonic wave generated from the electrical transmission signal modulated by the one of the at least four oscillator circuits.

17. The method of claim 15, further comprising:
receiving a configuration parameter from a sender; and
selecting the switch arrangement based on the configuration parameter.

18. The method of claim 17, wherein the at least one configuration parameter is a steering parameter.

19. The method of claim 17, wherein the at least four oscillator circuits comprise a first oscillator circuit with a phase of 0, a second oscillator circuit with a phase of $\pi/2$, a third oscillator circuit with a phase of $\pi$, and a fourth oscillator circuit with a phase of $3\pi/2$.

20. A method comprising:
selecting a switch arrangement associated with one or both of a steering position and a focusing position for a switch-matrix; and
switching switches in the switch-matrix in accordance with the selected switch arrangement to connect each transmit element in a transducer array of a sender transducer to one of at least four oscillators;
modulating a phase of an electrical transmission signal from an amplifier with the each of the least four oscillators circuits; and
emitting from each transmit element an ultrasonic wave generated from the electrical transmission signal modulated by the one of the at least four oscillator circuits to which the transmit element is connected by the switches in the switch element.

21. The method of claim 20, wherein the at least four oscillator circuits comprise a first oscillator circuit with a phase of 0, a second oscillator circuit with a phase of $\pi/2$, a third oscillator circuit with a phase of $\pi$, and a fourth oscillator circuit with a phase of $3\pi/2$.

22. The method of claim 20, wherein at least one of the transmit elements is connected by the switches to an oscillator circuit that is different from an oscillator circuit to which at least one other transmit element is connected.

* * * * *